United States Patent
Kiyotoshi (10) Patent No.: US 7,312,118 B2
(45) Date of Patent: Dec. 25, 2007

(54) SEMICONDUCTOR DEVICE AND METHOD OF MANUFACTURING THE SAME

(75) Inventor: Masahiro Kiyotoshi, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/360,503

(22) Filed: Feb. 24, 2006

(65) Prior Publication Data

US 2006/0138595 A1    Jun. 29, 2006

Related U.S. Application Data

(62) Division of application No. 10/721,082, filed on Nov. 26, 2003, now Pat. No. 7,187,026.

(30) Foreign Application Priority Data

Nov. 27, 2002 (JP) ............... 2002-344225

(51) Int. Cl.
*H01L 21/8242* (2006.01)

(52) U.S. Cl. ............ 438/253; 438/239; 438/254; 438/396; 438/397; 257/E21.648; 257/E27.034; 257/E27.048

(58) Field of Classification Search .......... 438/210, 438/239, 253, 254, 396, 397, FOR. 220, 438/FOR. 430; 257/E21.648, E27.034, E27.048
See application file for complete search history.

(56) References Cited

U.S. PATENT DOCUMENTS

| | | | |
|---|---|---|---|
| 4,278,989 A | 7/1981 | Baba et al. | |
| 5,565,699 A | 10/1996 | Kaneko et al. | |
| 5,812,364 A | 9/1998 | Oku et al. | |
| 5,814,849 A | 9/1998 | Azuma et al. | |

(Continued)

FOREIGN PATENT DOCUMENTS

JP     60-060751     4/1985

(Continued)

OTHER PUBLICATIONS

Japanese Patent Office Notification for Reasons of Rejection and English translation thereof in Japanese Patent Application No. 2002-344225.

(Continued)

*Primary Examiner*—George R. Fourson
*Assistant Examiner*—Joannie Adelle Garcia
(74) *Attorney, Agent, or Firm*—Finnegan, Henderson, Farabow, Garrett & Dunner, L.L.P.

(57) ABSTRACT

Disclosed is a semiconductor device comprising a semiconductor substrate, a capacitor structure formed above the semiconductor substrate and comprising a first electrode, a second electrode provided below the first electrode, a third electrode provided below the second electrode, a first dielectric film provided between the first electrode and the second electrode, and a second dielectric film provided between the second electrode and the third electrode, an insulating film covering the capacitor structure and having a first hole reaching the first electrode, a second hole reaching the second electrode, and a third hole reaching the third electrode, a first conductive connection electrically connecting the first electrode and the third electrode and having portions buried in the first and third holes, and a second conductive connection formed separately from the first conductive connection and having a portion buried in the second hole.

3 Claims, 9 Drawing Sheets

U.S. PATENT DOCUMENTS

| | | | |
|---|---|---|---|
| 6,284,588 B1 * | 9/2001 | Yu | 438/240 |
| 6,303,957 B1 | 10/2001 | Ohwa | |
| 6,340,832 B2 | 1/2002 | Kasahara | |
| 6,617,628 B2 | 9/2003 | Kim | |
| 6,753,193 B2 * | 6/2004 | Kim | 438/3 |
| 2002/0063271 A1 * | 5/2002 | Kim | 257/295 |
| 2002/0179955 A1 | 12/2002 | Morimoto et al. | |
| 2005/0287755 A1 * | 12/2005 | Bachmann et al. | 438/381 |

FOREIGN PATENT DOCUMENTS

| | | |
|---|---|---|
| JP | 04-293215 | 10/1992 |
| JP | 04-334007 | 11/1992 |
| JP | 04-356908 | 12/1992 |
| JP | 05-090489 | 4/1993 |
| JP | 2001-284526 | 10/2001 |
| JP | 2002-141417 | 5/2002 |

OTHER PUBLICATIONS

Houng, M.P. et al., "High Capacitance Density in a $Ta_2O_5$ Folded Capacitor Chip", Jpn. J. Appl. Phys. vol. 41, Part 1, No. 3A, pp. 1311-1314, (Mar. 2002).

* cited by examiner

SEMICONDUCTOR DEVICE AND METHOD OF MANUFACTURING THE SAME

CROSS-REFERENCE TO RELATED APPLICATIONS

This application is a divisional of application Ser. No. 10/721,082, filed Nov. 26, 2003, now U.S. Pat. No. 7,187,026, which is incorporated herein by reference herein and is based upon and claims the benefit of priority from prior Japanese Patent Application No. 2002-344225, filed Nov. 27, 2002, the entire contents of which are also incorporated herein by reference.

BACKGROUND OF THE INVENTION

1. Field of the Invention

The present invention relates to a semiconductor device and a method of manufacturing the same.

2. Description of the Related Art

Recent research and development of a large-scale integration circuit (LSI) has been focused on integrating an analog circuit such as an RF circuit and a logic circuit such as a CMOS circuit in a single chip. Such an LSI having an analog circuit and a logic circuit integrated in a single chip requires a high performance capacitor satisfying both characteristics required for the analog and logic circuits. To satisfy this, it has been proposed to use a metal-insulator-metal (MIM) capacitor formed of a dielectric film (insulating film) sandwiched between metal electrodes.

Furthermore, to attain the LSI mentioned above, the MIM capacitor must have a large capacitance, which inevitably increases the area occupied by the capacitor. Thus, to increase the capacitance per unit area, a stacked capacitor having a plurality of dielectric films and electrodes stacked therein may be used.

As a conventional stacked capacitor, a chip condenser has been widely known.

Figure 26:
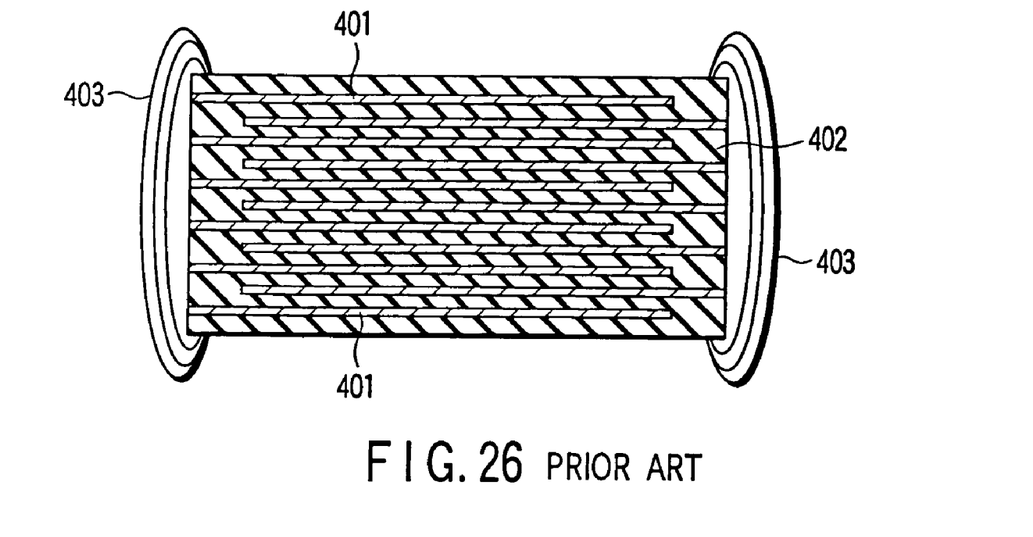
FIG. 26 is a schematic view of a structure of a conventional chip condenser.

FIG. 26 shows such a chip condenser. The chip condenser is formed by stacking electrodes 401 and dielectric films 402, followed by attaching metal films 403 onto both sides (edge portions) of the resultant stacked structure by means of soldering or the like.

A chip condenser having a stacked structure is described, for example, in Japanese Patent Application KOKAI Nos. 4-293215, 4-334007, and 4-356908.

On the other hand, when an MIM capacitor having a single dielectric film is formed in an LSI, the following manufacturing method is generally employed. A metal film serving as a lower electrode, a dielectric film, and a metal film serving as an upper electrode are stacked, and then these films are subjected to patterning to obtain the upper and lower electrodes. The upper and lower electrodes are patterned in different lithographic processes in order to prevent leakage current from flowing along the sidewall of the capacitor. Subsequently, an interlayer dielectric film is formed over the entire surface and then a contact hole is formed so as to reach the upper electrode and the lower electrode. A metal film serving as wiring is further formed over the entire surface, and then the metal film is patterned to form the wiring. In brief, an MIM capacitor having a single dielectric film is formed via four lithographic steps for the upper electrode, lower electrode, contact hole and wiring.

However, when a stacked capacitor having a plurality of dielectric films stacked therein is formed in an LSI, the number of lithographic steps greatly increases as the number of stacked films increases, leading to a great increase of manufacturing steps.

Figure 27:
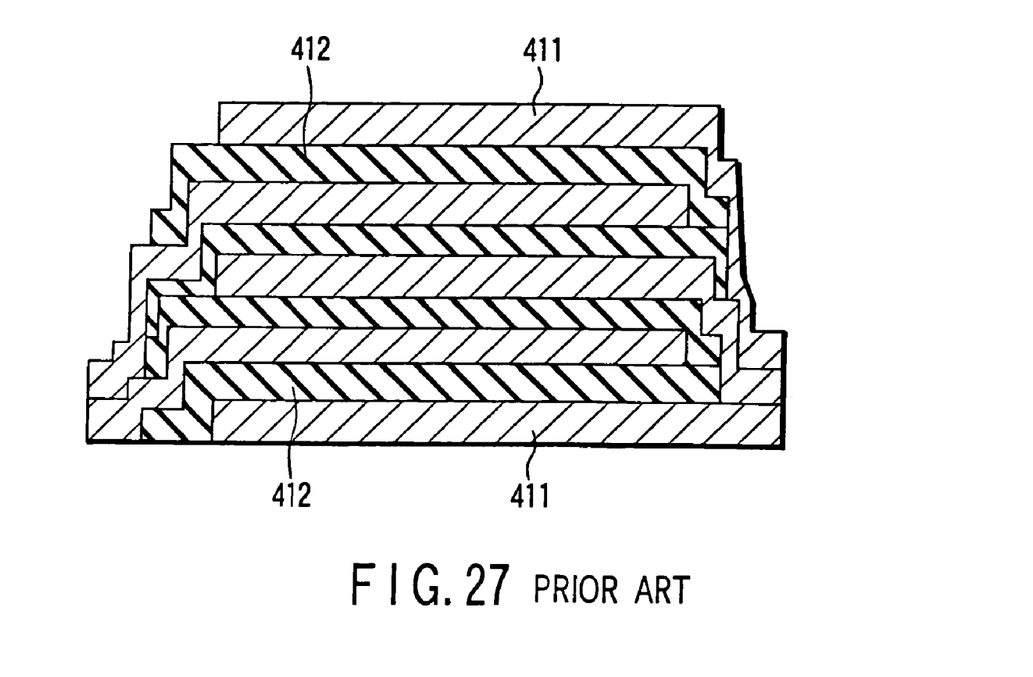
FIG. 27 is a view of a conventional semiconductor device for explaining problems in the art.

When a chip condenser having a construct (a stacked structure with a metal film on the edges) shown in FIG. 26 is used as the MIM capacitor for LSI, a problem occurs as shown in FIG. 27. Since the edge portions of a stacked structure formed of electrodes 411 and dielectric films 412 are not flat, the step coverage of the dielectric film at the edge portions deteriorates and an electric field converges to the edge portions, which easily increase leakage current. Therefore, the reliability and the yield of a capacitor decrease.

In summary, in the LSI having an analog circuit and a logic circuit integrated in a single chip, it is important to form a capacitor of high performance having a high capacitance without increasing the area occupied. To attain this, it is conceivable to use a stacked MIM capacitor; however the stacked MIM capacitor may cause problems of decreasing the reliability and increasing the number of manufacturing steps. Under the circumstances, it has been desired to develop a semiconductor device having a capacitor increased in capacitance per unit area without decreasing the reliability and increasing the number of manufacturing steps.

BRIEF SUMMARY OF THE INVENTION

According to a first aspect of the present invention, there is provided a semiconductor device comprising: a semiconductor substrate; a capacitor structure formed above the semiconductor substrate and comprising a first electrode, a second electrode provided below the first electrode, a third electrode provided below the second electrode, a first dielectric film provided between the first electrode and the second electrode, and a second dielectric film provided between the second electrode and the third electrode; an insulating film covering the capacitor structure and having a first hole reaching the first electrode, a second hole reaching the second electrode, and a third hole reaching the third electrode; a first conductive connection electrically connecting the first electrode and the third electrode and having portions buried in the first and third holes; and a second conductive connection formed separately from the first conductive connection and having a portion buried in the second hole.

According to a second aspect of the present invention, there is provided a method of manufacturing a semiconductor device comprising: forming a stacked film above a semiconductor substrate, the stacked film comprising a first conductive film, a second conductive film provided below the first conductive film, a third conductive film provided below the second conductive film, a first dielectric film provided between the first conductive film and the second conductive film, and a second dielectric film provided between the second conductive film and third conductive film; forming a capacitor structure comprising a first electrode formed of the first conductive film, a second electrode formed of the second conductive film, and a third electrode formed of the third conductive film by pattering the stacked film; forming an insulating film covering the capacitor structure and having a first hole reaching the first electrode, a second hole reaching the second electrode and a third hole reaching the third electrode; and forming a first conductive connection electrically connecting the first electrode and the third electrode and having portions buried in the first and third holes, and a second conductive connection formed separately from the first conductive connection and having a portion buried in the second hole.

DETAILED DESCRIPTION OF THE INVENTION

Embodiments of the present invention will be explained with reference to the accompanying drawings.

Embodiment 1

A method of manufacturing a semiconductor device (LSI having an analog circuit and a logic circuit integrated in a single chip) according to a first embodiment of the present invention will be explained with reference to FIGS. 1 to 10. In this embodiment, two silicon nitride films are used as dielectric films of a capacitor and realize a capacitance of 4 to 5 $fF/\mu m^2$.

Figure 1:
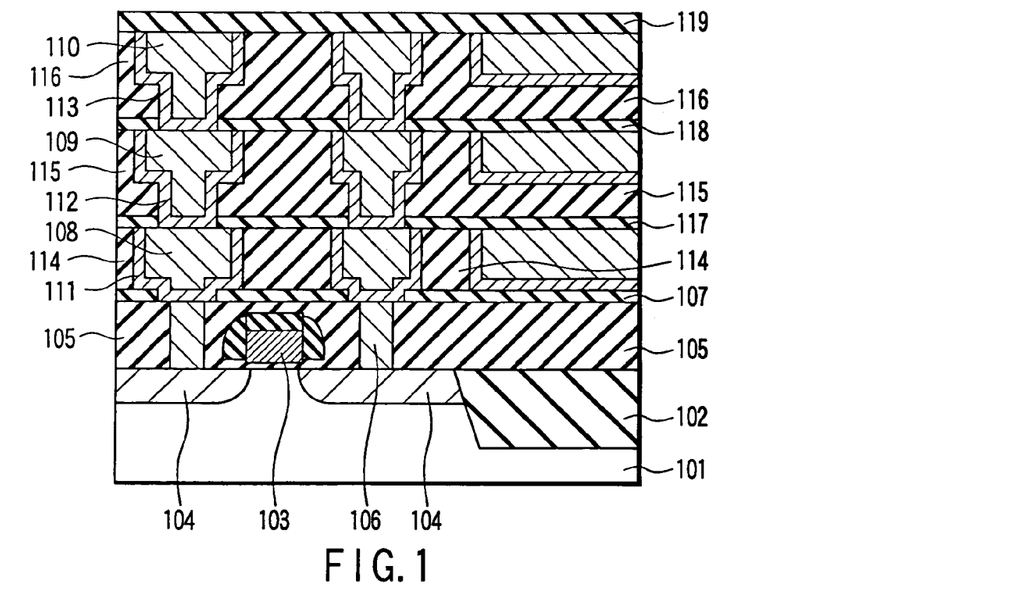
FIG. 1 is a sectional view schematically illustrating part of a manufacturing process of a semiconductor device according to a first embodiment of the present invention.

First, as shown in FIG. 1, an isolation region 102, a gate electrode 103 and diffusion region 104 are formed on a silicon substrate (semiconductor substrate) 101. Subsequently, an interlayer dielectric film 105 is deposited over the entire surface and further planarization is performed. Subsequently, a viahole is formed in the interlayer dielectric film 105 and filled with a metal film 106.

Then, a multi level interconnection structure is formed on the resultant structure. More specifically, metal wirings 108, 109, and 110, barrier layers 111, 112, and 113, interlayer dielectric films 114, 115, and 116, and silicon nitride films 107, 117, 118, and 119 are formed. The metal wirings 108, 109 and 110 are formed by filling in grooves and holes of the interlayer dielectric films 114, 115 and 116 with a metal film such as copper, followed by subjecting to a damascene process. The barrier layers 111, 112, and 113 are provided in order to prevent materials of metal wiring 108, 109 and 110 from diffusing into the interlayer dielectric films 114, 115 and 116 and, for example, formed of TiN.

As mentioned above, the lower structure of a semiconductor device as shown in FIG. 1 is constructed. On and after the step shown in FIG. 2, the lower structure shown in FIG. 1 will be omitted except for the silicon nitride film 19, for brevity's sake.

Figure 2:
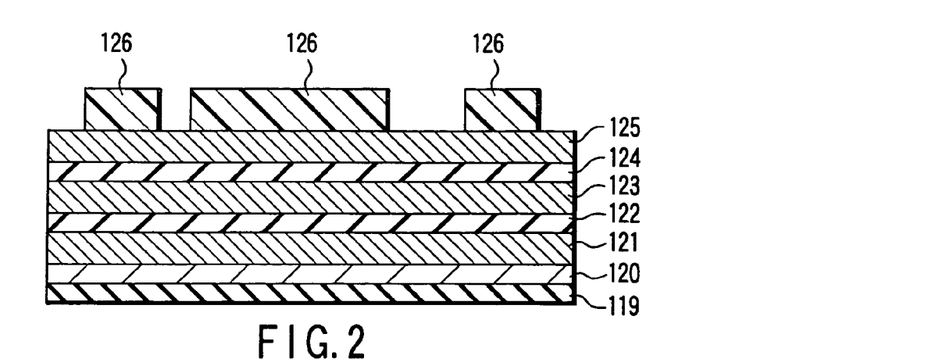
FIG. 2 is a sectional view schematically illustrating part of the manufacturing process of the semiconductor device according to the first embodiment of the present invention.

After the lower structure shown in FIG. 1 is formed, a titanium (Ti) film 120, titanium nitride (TiN) film 121 (third conductive film), silicon nitride (SiN) film 122 (second dielectric film), titanium nitride film 123 (second conductive film), silicon nitride film 124 (first dielectric film) and titanium nitride film 125 (first conductive film) are sequentially formed on the entire surface of the silicon nitride film 119, as shown in FIG. 2. The titanium nitride films 121, 123 and 125 are formed by a PVD process and the silicon nitride films 122 and 124 are formed by a PVD process or plasma CVD process. After a photoresist film is formed on the titanium nitride film 125 by coating, a resist pattern 126 (mask pattern) is lithographically formed.

Figure 3:
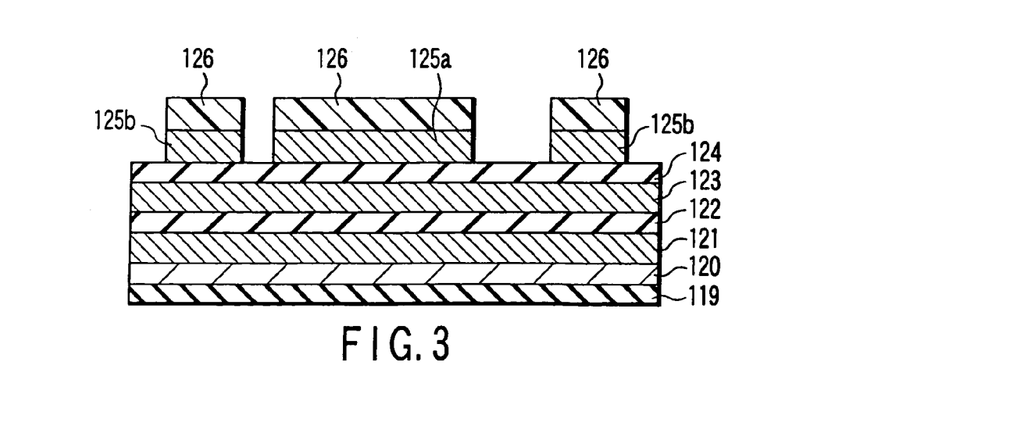
FIG. 3 is a sectional view schematically illustrating part of the manufacturing process of the semiconductor device according to the first embodiment of the present invention.
Figure 4:
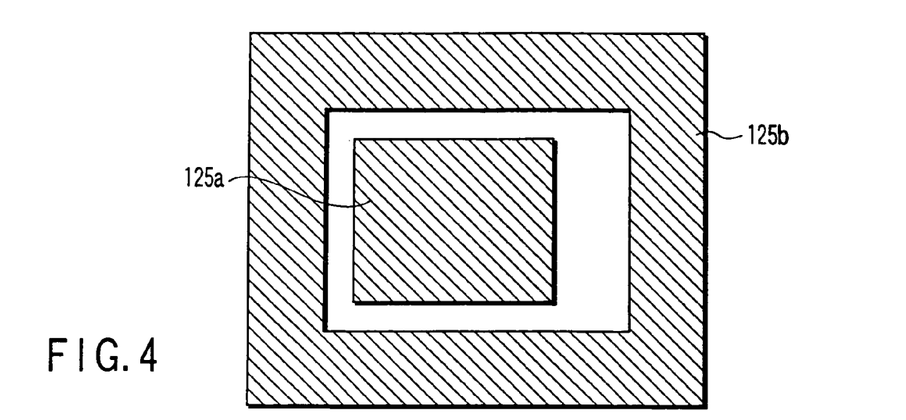
FIG. 4 is a schematic plan view showing a pattern formation region shown in FIG. 3.

As shown in FIG. 3, the titanium nitride film 125 is subjected to reactive ion etching (RIE) with the photoresist pattern 126 used as a mask under the condition that the etching rate of the titanium nitride film is larger than that of the silicon nitride. By the etching process, a capacitor electrode 125*a* (first electrode) and a ring-shape conductive portion 125*b* surrounding the electrode 125*a* are formed so as to separate from each other. FIG. 4 is a plan view showing the relationship between the electrode 125*a* and the ring-shape conductive portion 125*b* obtained in this step.

Figure 5:
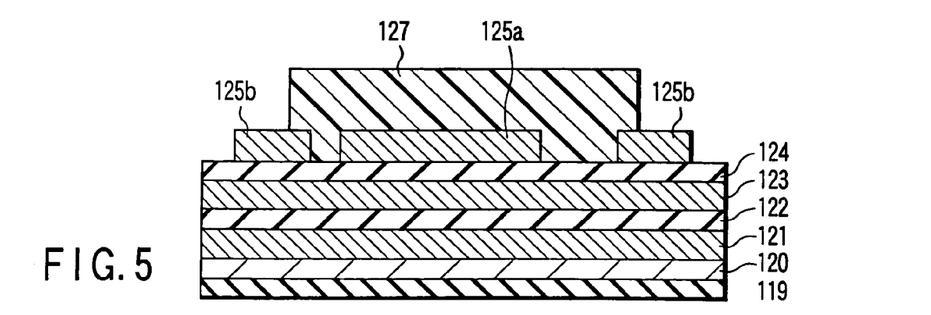
FIG. 5 is a sectional view schematically illustrating part of the manufacturing process of the semiconductor device according to the first embodiment of the present invention.

Next, as shown in FIG. 5, the resist pattern 126 is removed by ashing. Subsequently, a photoresist film is formed on the entire surface and the resist pattern 127 is lithographically formed. The photoresist pattern 127 covers the entire electrode 125*a* and the space between the electrode 125*a* and the ring-shape conductive portion 125*b* and the inner peripheral edge of the ring-shape conductive portion 125*b*. Since the MIM capacitor of this embodiment has an extremely large square in the order of several hundred microns, it is easy to perform lithography in the manner mentioned above.

Figure 6:
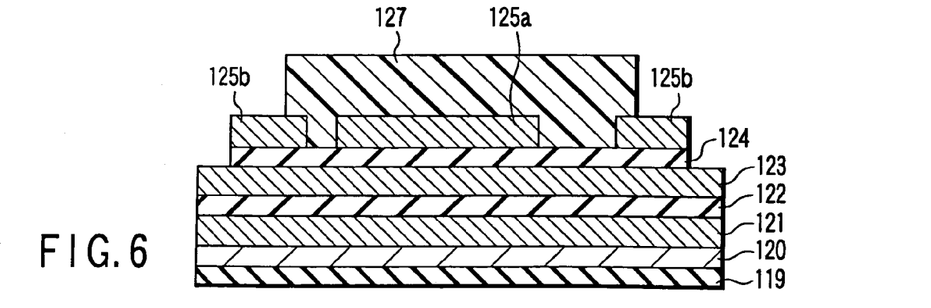
FIG. 6 is a sectional view schematically illustrating part of the manufacturing process of the semiconductor device according to the first embodiment of the present invention.

As shown in FIG. 6, the silicon nitride film 124 is etched by RIE with the photoresist pattern 127 and the ring-shape conductive portion 125*b* used as a mask under the condition that the etching rate of the silicon nitride film is sufficiently larger than that of the titanium nitride film.

Figure 7:
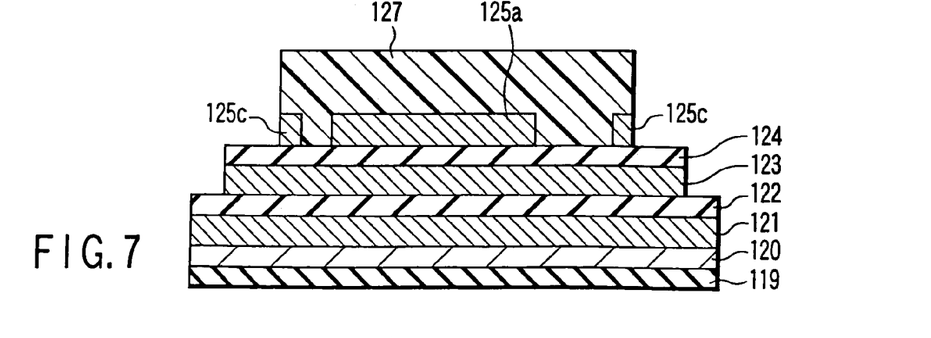
FIG. 7 is a sectional view schematically illustrating part of the manufacturing process of the semiconductor device according to the first embodiment of the present invention.

Next, as shown in FIG. 7, the titanium nitride film 125*b* is etched under the condition that the etching rate of the titanium nitride film is sufficiently larger than that of the silicon nitride film with the resist pattern 127 used as a mask to form a ring-shape electrode 125*c*. Simultaneously, the titanium nitride film 123 is etched with the pattern of the silicon nitride film 124 used as a mask.

Figure 8:
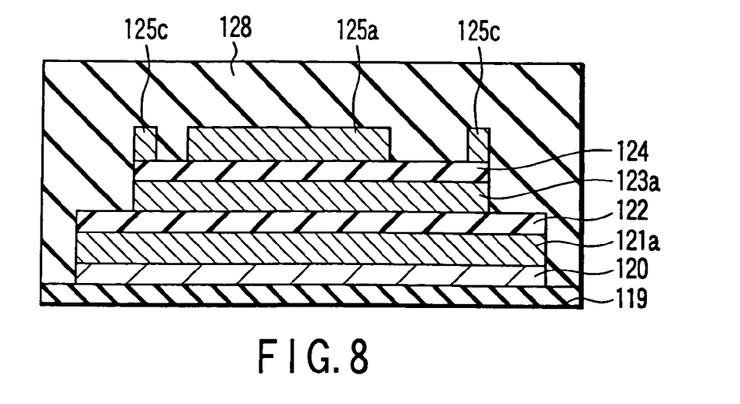
FIG. 8 is a sectional view schematically illustrating part of the manufacturing process of the semiconductor device according to the first embodiment of the present invention.

Subsequently, as shown in FIG. 8, the silicon nitride film 124, titanium nitride film 123, silicon nitride film 122, titanium nitride film 121 and titanium film 120 are etched as shown below.

First, etching is performed under the condition that the etching rate of the silicon nitride film is sufficiently larger than that of the titanium nitride film, thereby etching the silicon nitride film 124 with the resist pattern 127 used as a mask. Simultaneously, the silicon nitride film 122 is etched with the pattern of the titanium nitride film 123 used as a mask.

Subsequently, etching is performed under the condition that the etching rate of the titanium nitride film is sufficiently larger than that of the silicon nitride film, thereby etching the titanium nitride film 123 with the resist pattern 127 used as a mask to form an electrode 123*a* (second electrode). Simultaneously, the titanium nitride film 121 is etched with the pattern of the silicon nitride film 122 used as a mask to form an electrode 121*a* (third electrode). In the etching process, the titanium film 120 is also etched.

In this way, a capacitor structure having the outer end of the silicon nitride film 124 and the outer end of the electrode 123*a* aligned with the outer end of the ring-shape electrode 125*c*, and the outer end of the electrode 121*a* aligned with the outer end of the pattern of the silicon nitride film 122 can be obtained. After the photoresist pattern 127 is removed by ashing, an interlayer dielectric film (interlayer insulating film) 128 is formed over the entire surface.

Figure 9:
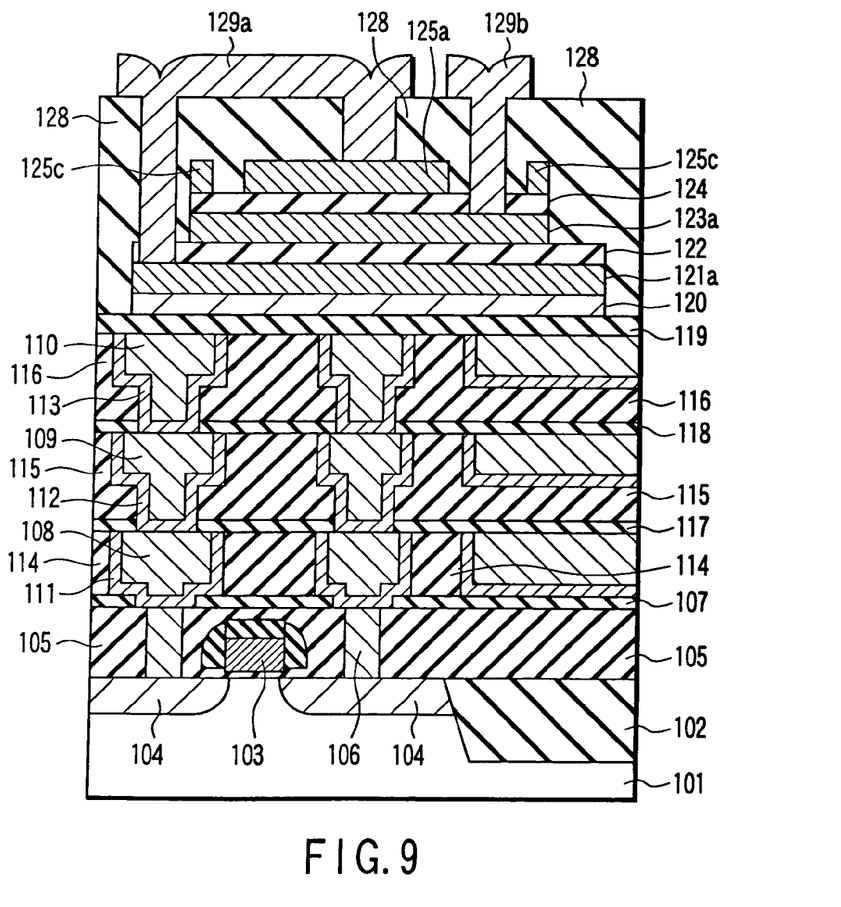
FIG. 9 is a sectional view schematically illustrating part of the manufacturing process of the semiconductor device according to the first embodiment of the present invention.

Next, as shown in FIG. 9, a photoresist film is formed on the interlayer dielectric film 128 by coating and a photoresist pattern (not shown) is lithographically formed. Subsequently, the interlayer dielectric film 128 and the silicon nitride films 122 and 124 are etched by RIE with this photoresist pattern used as a mask, thereby forming contact holes reaching the electrodes 121*a*, 123*a* and 125*a*, respectively.

Thereafter, a metal film is formed over the entire surface so as to fill the contact holes. Subsequently, a photoresist film is coated on the metal film and a photoresist pattern (not shown) is lithographically formed. The metal film is etched by RIE with the photoresist pattern used as a mask to form wiring 129*a* (first conductive connection) and wiring 129*b* (second conductive connection) separately from each other. The electrode 121*a* and the electrode 125*a* are electrically connected by the wiring 129*a*.

Figure 10:
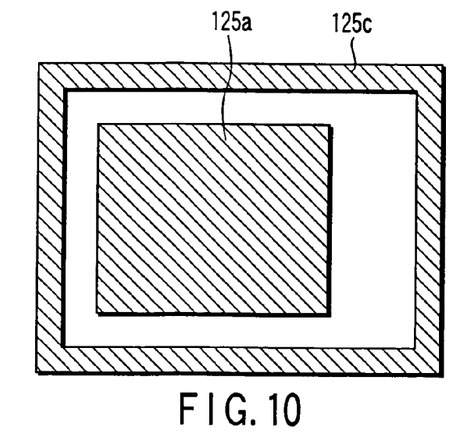
FIG. 10 is a schematic plan view showing a pattern formation region shown in FIG. 9.

In the manner mentioned above, as shown in FIG. 9, it is possible to obtain a semiconductor device having a capacitor formed on the lower structure. FIG. 10 is a plan view showing the relationship between the electrode 125*a* and the ring-shape electrode 125*c* obtained in the above. Thereafter, the passivation film is formed but explanation thereof will be omitted herein.

Figure 11:
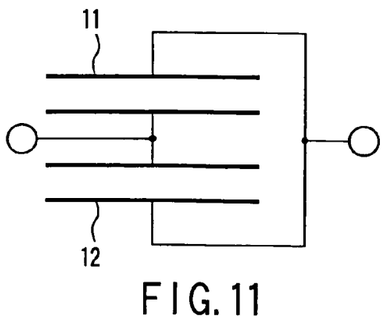
FIG. 11 shows an equivalent circuit of a capacitor according to the first embodiment.

FIG. 11 shows an equivalent circuit of a capacitor obtained in this embodiment. A capacitor 11 of the upper-layer side having an MIM structure of the electrode 125*a*, dielectric film 124 and electrode 123*a* is formed, and a capacitor 12 of the lower-layer side having an MIM structure of the electrode 123*a*, dielectric film 122 and the electrode 121*a* is formed. Since these two capacitors 11 and 12 are connected in parallel, a stacked capacitor having a two-fold capacitance compared to a single-layer capacitor can be obtained.

As described, according to this embodiment, it is possible to increase capacitance per unit area by use of a stacked capacitor structure. Furthermore, the number of lithographic steps is four, which is the same as in a conventional single-layer capacitor. Therefore, the capacitance of the capacitor per unit area can be increased without increasing the number of lithographic steps.

Since the conductive films 121, 123 and 125 are formed of the same material and the dielectric films 122 and 124 are formed of the same material, selective etching steps shown in FIGS. 6 to 8 can be easily performed without fail. Therefore, the effect of preventing the number of lithographic steps from increasing can be obtained.

In this embodiment, conductive connections 129*a* and 129*b* are formed by filling contact holes formed in a dielectric film (insulating film) with a metal film. Therefore, the conductive connection is not formed at the side of a capacitor structure as is in a conventional capacitor, so that braking of wire or concentration of an electric field can be prevented in comparison with the conventional folded capacitor. As a result, the reliability and yield can be improved.

In addition, the outer end of the pattern of the electrode 123*a* is positioned outside the pattern of the electrode 125*a*, and the outer end of the pattern of the electrode 121*a* is positioned outside the pattern of the electrode 123*a*. By virtue of this, it is easy to form a contact hole in the region where the electrode patterns are not overlapped with each other.

Furthermore, in this embodiment, a ring-shape electrode 125c is formed so as to surround the electrode 125a. Therefore crosstalk can be reduced by the shield effect of the ring-shape electrode 125c.

Note that a silicon nitride film is used as a dielectric film and titanium nitride film as an electrode film, in this embodiment. However, other films may be used. As a dielectric film, an alumina film, a tantalum (Ta) oxide film, a hafnium (Hf) oxide film, a zirconium (Zr) oxide film, or the like may be used. As the electrode film, a tungsten (W) nitride film, a tantalum (Ta) nitride film, a TiN/AlCu/TiN stacked film, or the like may be used.

[Embodiment 2]

A method of manufacturing a semiconductor device according to a second embodiment of the present invention (LSI having an analog circuit and a logic circuit integrated in the same chip) will be explained with reference to FIGS. 12 to 18. In this embodiment, four tantalum oxide films are used as dielectric films of a capacitor and realize a capacitance of 10 to 18 fF/$\mu$m$^2$. Note that the structure shown in FIGS. 12 to 18 has the same lower structure as shown in the first embodiment (FIG. 1). However, the lower structure is not shown in the figures except silicon nitride film 119 for brevity's sake.

Figure 12:
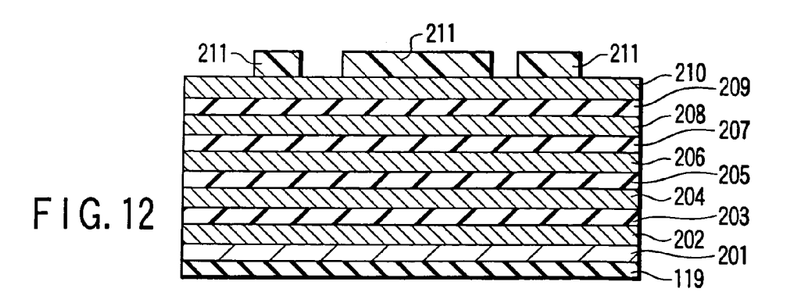
FIG. 12 is a sectional view schematically illustrating part of a manufacturing process of a semiconductor device according to a second embodiment of the present invention.

After the lower structure shown in FIG. 1 is formed, as shown in FIG. 12, a titanium film 201, titanium nitride film 202 (fifth conductive film), tantalum oxide film 203 (fourth dielectric film), titanium nitride film 204 (fourth conductive film), tantalum oxide film 205 (third dielectric film), titanium nitride film 206 (third conductive film), tantalum oxide film 207 (second dielectric film), titanium nitride film 208 (second conductive film), tantalum oxide film 209 (first dielectric film), and titanium nitride film 210 (first conductive film) are sequentially formed on the entire surface of the silicon nitride film 119 by a PVD process. Subsequently, a photoresist film is formed on the titanium nitride film 210 by coating and a resist pattern 211 (mask pattern) is lithographically formed.

Figure 13:
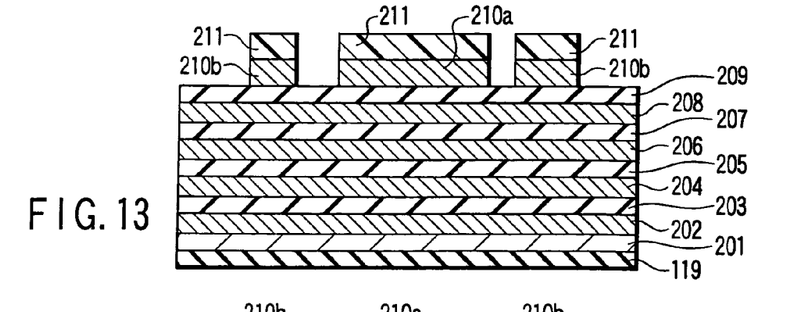
FIG. 13 is a sectional view schematically illustrating part of the manufacturing process of the semiconductor device according to the second embodiment of the present invention.

As shown in FIG. 13, a titanium nitride film 210 is etched by RIE with the photoresist pattern 211 used as a mask under the condition that the etching rate of the titanium nitride is sufficiently larger than that of the tantalum oxide film. By the etching process, an electrode 210a (first electrode) of a capacitor and a ring-shape conductive portion 210b surrounding the electrode 210a are formed so as to separate from each other. The relationship between the electrode 210a and the ring-shape conductive portion 210b obtained in this step is the same as that shown in the plan view (FIG. 4) of the first embodiment.

Figure 14:
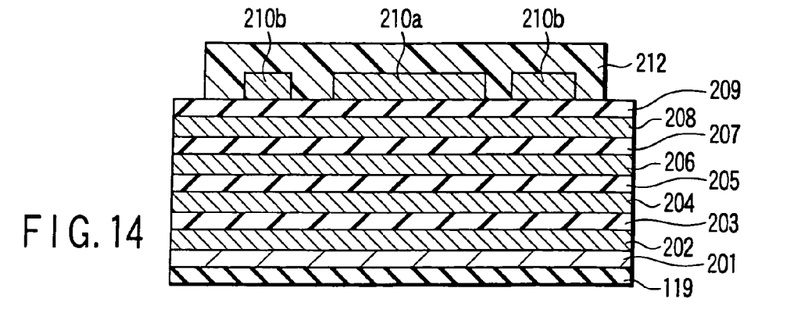
FIG. 14 is a sectional view schematically illustrating part of the manufacturing process of the semiconductor device according to the second embodiment of the present invention.

Next, as shown in FIG. 14, the photoresist pattern 211 is removed by ashing. After a photoresist film is coated over the entire surface, a resist pattern 212 is lithographically formed. The resist pattern 212 covers over the entire region including the electrode 210a and the ring-shape conductive portion 210b.

Figure 15:
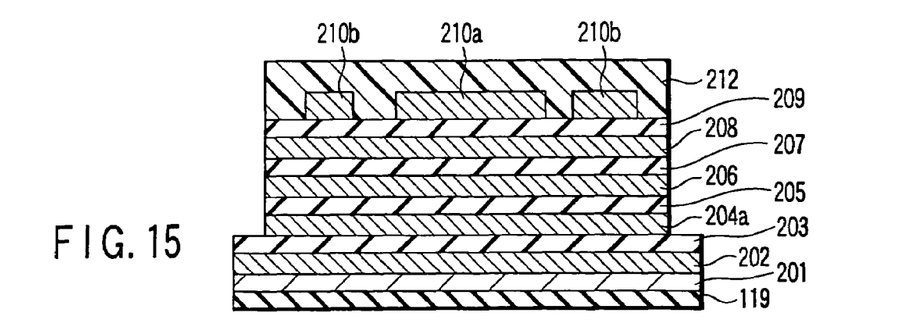
FIG. 15 is a sectional view schematically illustrating part of the manufacturing process of the semiconductor device according to the second embodiment of the present invention.

Next, as shown in FIG. 15, the tantalum oxide film 209, titanium nitride film 208, tantalum oxide film 207, titanium nitride film 206, tantalum oxide film 205 and titanium nitride film 204 are sequentially etched by RIE with the photoresist pattern 212 used as a mask to form a capacitor electrode 204a (fourth electrode).

Figure 16:
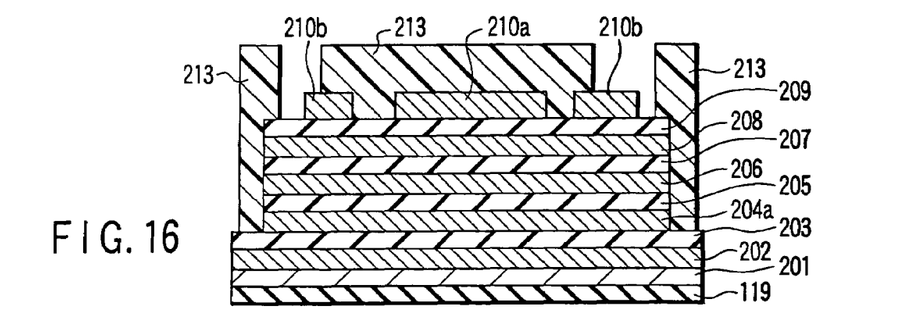
FIG. 16 is a sectional view schematically illustrating part of the manufacturing process of the semiconductor device according to the second embodiment of the present invention.

Next, as shown in FIG. 16, the resist pattern 212 is removed by ashing. Subsequently, a photoresist film is formed over the entire surface by coating, and the photoresist pattern 213 is lithographically formed. The resist pattern 213 covers the entire electrode 210a and the space between the electrode 210a and the ring-shape conductive portion 210b and the inner peripheral edge of the ring-shape conductive portion 210b. Since the MIM capacitor of this embodiment has an extremely large square in the order of several hundred microns, such lithography can be made easily.

Figure 17:
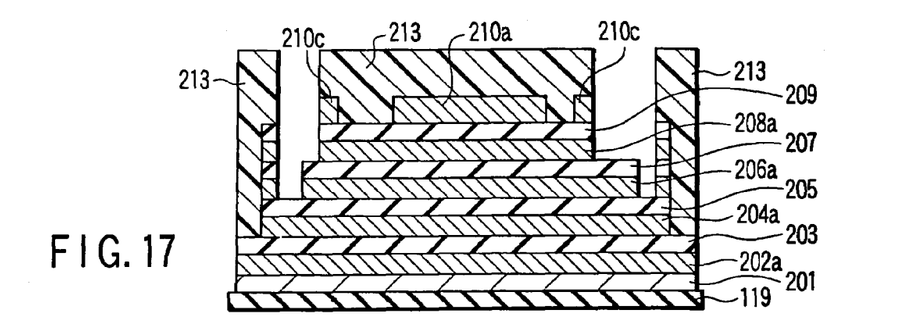
FIG. 17 is a sectional view schematically illustrating part of the manufacturing process of the semiconductor device according to the second embodiment of the present invention.

Next, as shown in FIG. 17, tantalum oxide films 209 and 203 are etched by RIE with the resist pattern 213 and the ring-shape conductive portion 210b used as a mask under the condition that the etching rate of the tantalum oxide film is sufficiently larger than that of the titanium nitride film.

Subsequently, the titanium nitride film is etched under the condition that the etching rate of the titanium nitride film is sufficiently larger than that of the tantalum oxide film. As a result, the titanium nitride film 210b is etched with the resist pattern 213 used as a mask to form a ring-shape electrode 210c. At the same time, the titanium nitride film 208 is etched with the pattern of the tantalum oxide film 209 used as a mask and simultaneously the titanium nitride film 202 is etched with the resist pattern 213 used as a mask to form an electrode 202a (fifth electrode). Furthermore, the titanium film 201 is etched in the etching step.

Subsequently, the tantalum oxide film 209, titanium nitride film 208, tantalum oxide film 207 and titanium nitride film 206 are etched by RIE as follows:

First, etching is performed under the condition that the etching rate of the tantalum oxide film is sufficiently larger than that of the titanium nitride film, thereby etching the tantalum oxide film 209 with the resist pattern 213 used as a mask. Simultaneously, the tantalum oxide film 207 is etched with the pattern of the titanium nitride film 208 used as a mask.

Then, etching is performed under the condition that the etching rate of the titanium nitride film is sufficiently larger than that of the tantalum oxide film, thereby etching the titanium nitride film 208 with the photoresist pattern 213 used as a mask to form an electrode 208a (second electrode). Simultaneously, the titanium nitride film 206 is etched with the pattern of the tantalum oxide film 207 used as a mask to form an electrode 206a (third electrode).

In this way, it is possible to obtain a capacitor structure having the outer end of the pattern of the tantalum oxide film 209 and the outer end of the electrode 208a aligned with the outer end of the ring-shape electrode 210c, and the outer end of the electrode 206a aligned with the outer end of the pattern of the tantalum oxide film 207.

Figure 18:
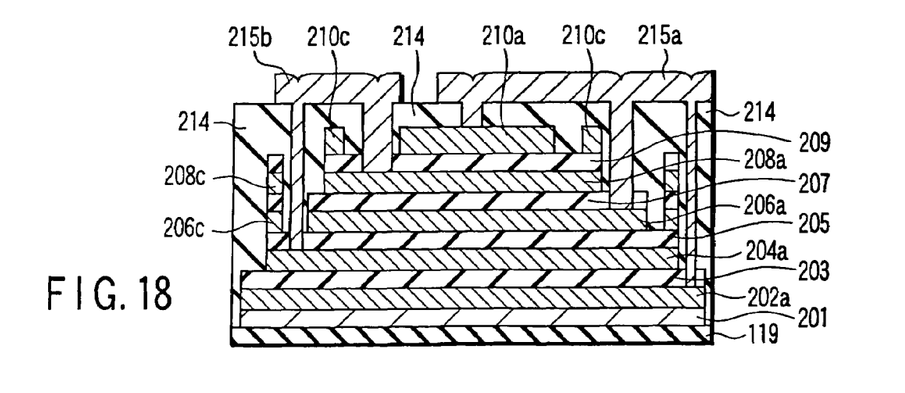
FIG. 18 is a sectional view schematically illustrating part of the manufacturing process of the semiconductor device according to the second embodiment of the present invention.

Next, as shown in FIG. 18, the photoresist pattern 213 is removed by ashing, an interlayer dielectric film (interlayer insulating film) 214 is formed over the entire surface. Subsequently, a photoresist film is formed on the interlayer dielectric film 214 by coating, a resist pattern (not shown) is lithographically formed. Thereafter, the interlayer dielectric film 214, tantalum oxide films 203, 205, 207, and 209 are etched by RIE with the resist pattern used as a mask to form contact holes reaching electrodes 202a, 204a, 206a, 208a and 210a, respectively.

Next, a metal film is formed over the entire structure so as to fill the contact holes. Subsequently, a photoresist film is formed on the metal film by coating and then a resist pattern (not shown) is lithographically formed. The metal film is etched by RIE with the resist pattern used as a mask to form wiring 215a (first conductive connection) and wiring 215b (second conductive connection) separately from each other. The electrodes 202a, 206a and 210a are electrically connected by the wiring 215a. The electrodes 204a and 208a are electrically connected by the wiring 215b.

In the manner mentioned above, as shown in FIG. 18, it is possible to obtain a semiconductor device having a capacitor formed on the lower structure (not shown). Thereafter, a passivation film is formed but explanation thereof will be omitted herein.

Figure 19:
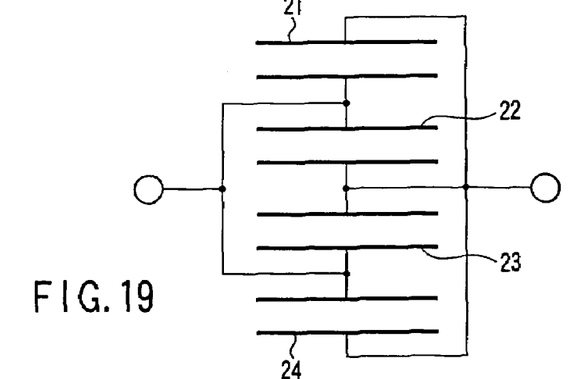
FIG. 19 is an equivalent circuit of a capacitor according to the second embodiment.

FIG. 19 shows an equivalent circuit of a capacitor obtained by the embodiment. More specifically, it is possible to form a capacitor 21 having an MIM structure of the electrode 210a, dielectric film 209, and electrode 208a; and a capacitor 22 having an MIM structure of the electrode 208a, dielectric film 207, and the electrode 206a; a capacitor 23 having an MIM structure of the electrode 206a, dielectric film 205, and an electrode 204a; and a capacitor 24 having an MIM structure of the electrode 204a, dielectric film 203, and the electrode 202a. Since these four capacitors 21, 22, 23 and 24 are connected in parallel, a stacked capacitor having a four-fold capacitance compared to a single-layer capacitor can be obtained.

As described, in the manufacturing step according to this embodiment, the number of lithographic steps is five, which is larger by one than that of a conventional single-layer capacitor. Therefore, capacitance of a capacitor per unit area can be increased without virtually increasing the number of lithographic steps.

As described in this embodiment, the same effect as in the first embodiment can be obtained. More specifically, the capacitance per unit area can be increased without virtually increasing the number of lithographic steps. Furthermore, it is possible to prevent braking of wire or concentration of an electric field at the edge portion of the capacitor in comparison with the conventional folded capacitor. As a result, the reliability and yield can be improved.

In this embodiment, the ring-shape electrodes 208c and 206c are formed other than the ring-shape electrode 210c. Therefore, crosstalk can be reduced by the shield effect of these ring-shape electrodes 210c, 208c and 206c.

In this embodiment, a tantalum oxide film is used as a dielectric film, a titanium nitride film is used as an electrode film. Other films may be used. As the dielectric film, a silicon nitride film, alumina film, hafnium oxide film, zirconium oxide film, or the like may be used. As an electrode film, tungsten nitride film, tantalum nitride film, TiN/AlCu/TiN stacked film, or the like may be used.

Embodiment 3

A method of manufacturing a semiconductor device according to a third embodiment of the present invention will be explained with reference to FIGS. 20 to 25. In this embodiment, a multi-layered capacitor is used for ferroelectronic RAM (FRAM). As the dielectric film for the capacitor, a Pb(Zr, Ti)O$_3$ (PZT) film is used and a platinum (Pt) film is used as an electrode.

Figure 20:
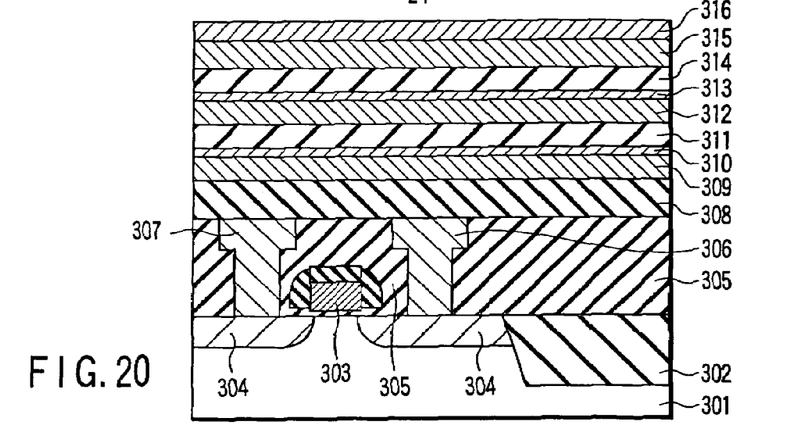
FIG. 20 is a sectional view schematically illustrating part of a manufacturing process of a semiconductor device according to a third embodiment of the present invention.

As shown in FIG. 20, an isolation region 302, a gate electrode 303, and a diffusion region 304 are formed on a silicon substrate 301. Subsequently, an interlayer dielectric film 305 is deposited on the entire surface and planarization is performed. A bit line 306 and a contact plug 307, which are connected to diffusion regions 304, are formed in the interlayer dielectric film 305. Further, an interlayer dielectric film 308 is formed over the entire surface.

After a Pt film 309 (third conductive film), a titanium film 310, and a PZT film 311 (second dielectric film) are formed by a PVD process, a PZT film 311 is crystallized by an RTO process. Subsequently, a Pt film 312 (second conductive film), a titanium film 313 and a PZT film 314 (first dielectric film) are formed, and thereafter the PZT film 314 is crystallized by an RTO process. Further, a Pt film 315 (first conductive film) and an alumina film 316 are formed on the PZT film 314.

Figure 21:
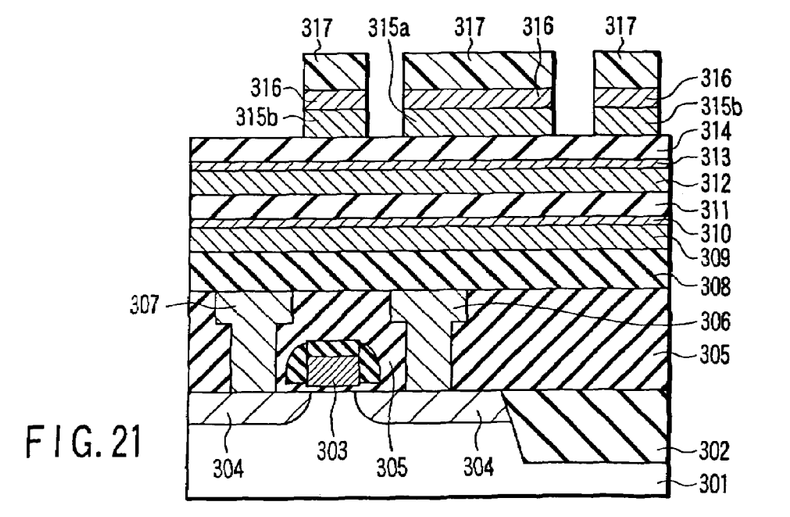
FIG. 21 is a sectional view schematically illustrating part of the manufacturing process of the semiconductor device according to the third embodiment of the present invention.

Next, as shown in FIG. 21, a photoresist film is formed on an alumina film 316 by coating and a resist pattern 317 (mask pattern) is lithographically formed. Subsequently, the Pt film 315 and the alumina film 316 are etched by RIE with the resist pattern 317 used as a mask, thereby forming a capacitor electrode 315a (first electrode) and a ring-shape conductive portion 315b surrounding the electrode 315a, separately from each other. The relationship between the electrode 315a and the ring-shape conductive portion 315b obtained in this step is the same as that shown in the plan view (FIG. 4) of the first embodiment.

Figure 22:
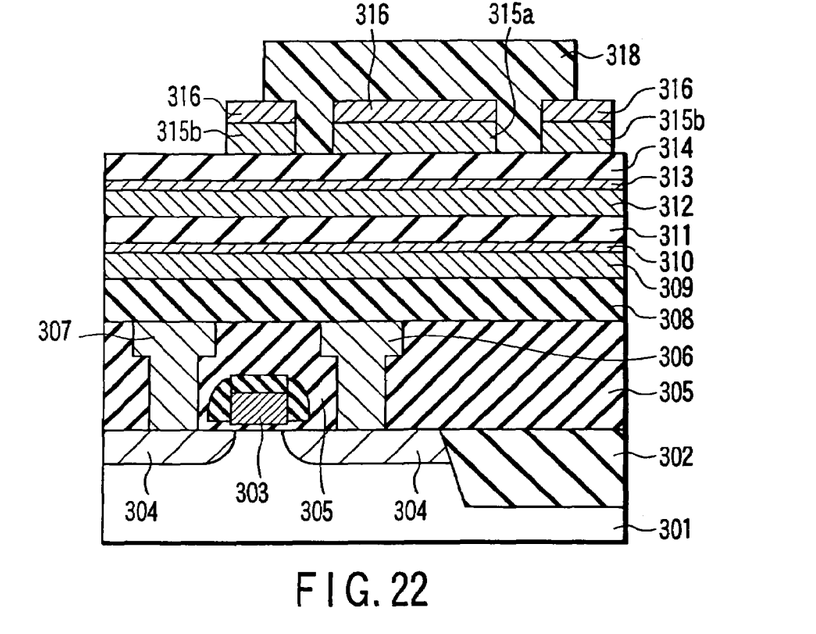
FIG. 22 is a sectional view schematically illustrating part of the manufacturing process of the semiconductor device according to the third embodiment of the present invention.

Next, as shown in FIG. 22, the resist pattern 317 is removed by ashing. Subsequently, a photoresist film is formed on the entire surface by coating and the photoresist pattern 318 is lithographically formed. The resist pattern 318 covers the entire electrode 315a, the space between the electrode 315a and the ring-shape conductive portion 315b, and inner peripheral edge of the ring-shape conductive portion 315b. Since the size of the FRAM capacitor has an extremely larger than a DRAM capacitor, such a lithographic step can be easily performed.

Figure 23:
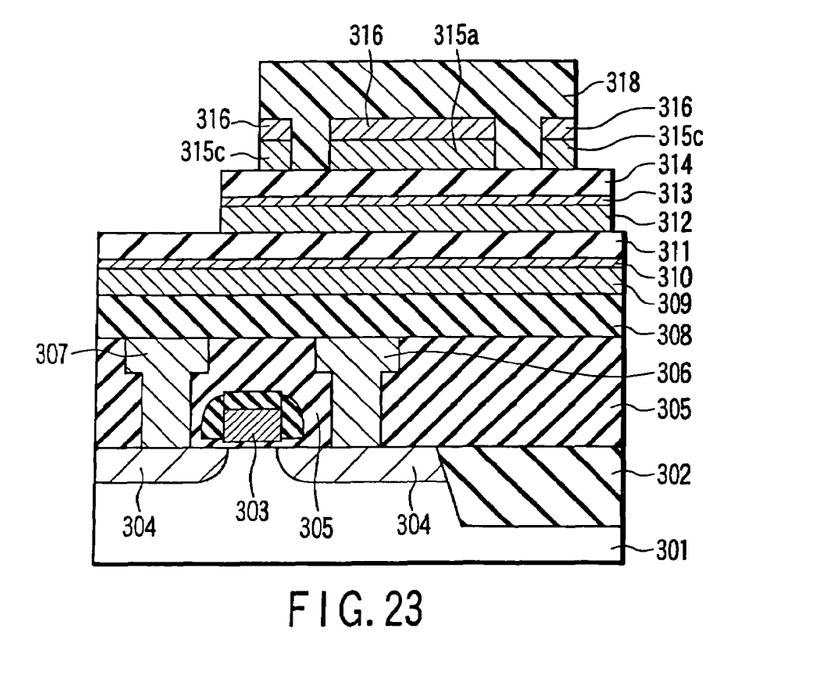
FIG. 23 is a sectional view schematically illustrating part of the manufacturing process of the semiconductor device according to the third embodiment of the present invention.

Next, as shown in FIG. 23, the alumina film 316, the PZT film 314, and the titanium film 313 are etched by RIE with the resist pattern 318 and the ring-shape conductive portion 315b used as a mask under the condition that the etching rates of the alumina film 316, the PZT film 314, and the titanium film 313 are sufficiently larger than that of the Pt film.

Next, etching is performed under the condition that the etching rate of the Pt film is sufficiently larger than the PZT film. The Pt film 315b is etched with the resist pattern 318 used as a mask to form a ring-shape electrode 315c. Simultaneously, the Pt film 312 is etched with the pattern of the PZT film 314 used as a mask.

Figure 24:
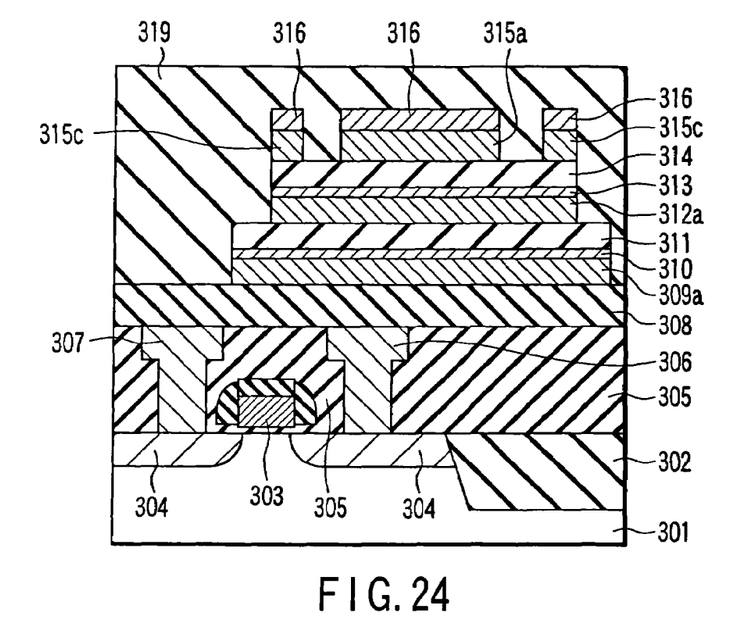
FIG. 24 is a sectional view schematically illustrating part of the manufacturing process of the semiconductor device according to the third embodiment of the present invention.

Next, as shown in FIG. 24, the PZT film 314, titanium film 313, Pt film 312, PZT film 311, titanium film 310, and Pt film 309 are etched by RIE as follows.

First, etching is performed under the condition that the etching rates of the PZT film and titanium film are sufficiently larger than that of the Pt film, thereby etching the PZT film 314 and titanium film 313 with the resist pattern 318 used as a mask. Simultaneously, the PZT film 311 and titanium firm 310 are etched with the pattern of the Pt film 312 used as a mask.

Then, etching is performed under the condition that the etching rate of the Pt film is sufficiently larger than that of the PZT film, thereby etching the Pt film 312 with the resist pattern 318 used as a mask to form an electrode 312a (second electrode). Simultaneously, the Pt film 309 is etched with the pattern of the PZT film 311 used as a mask to form an electrode 309a (third electrode). After the resist pattern 318 is removed by ashing, an interlayer dielectric film (interlayer insulating film) 319 is formed over the entire surface.

Figure 25:
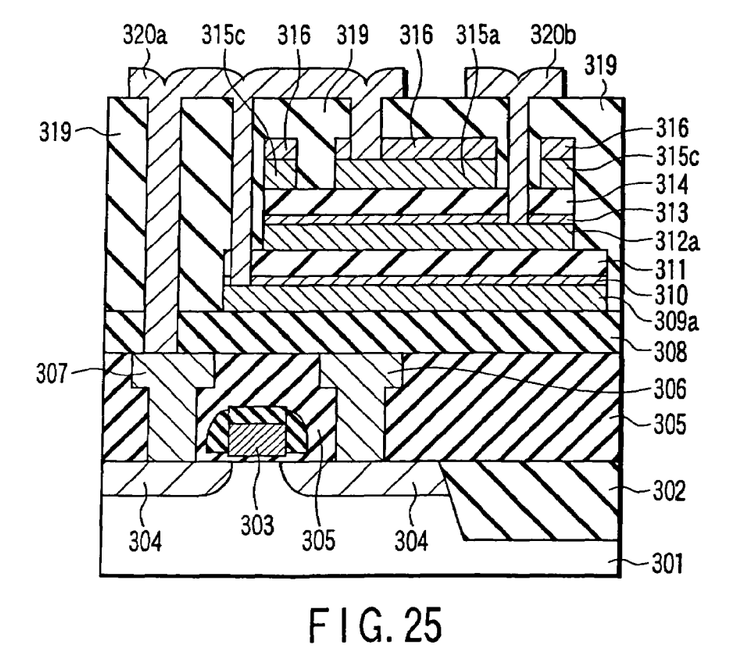
FIG. 25 is a sectional view schematically illustrating part of the manufacturing process of the semiconductor device according to the third embodiment of the present invention.

Next, as shown in FIG. 25, after a photoresist film is formed by coating on the interlayer dielectric film 319, a photoresist pattern (not shown) is lithographically formed. Subsequently, the interlayer dielectric film 319, alumina film 316, PZT film 314, titanium film 313, PZT film 311, titanium film 310 and interlayer dielectric film 308 are etched by RIE with the resist pattern used as a mask to form contact holes reaching the electrodes 315a, 312a, 309a and contact plug 307, respectively.

Next, a metal film is formed over the entire structure so as to fill the contact holes. Subsequently, a photoresist film is coated on the metal film and then a photoresist pattern (not shown) is lithographically formed. The metal film is etched by RIE with the resist pattern used as a mask to form wiring 320a (first conductive connection) and wiring 320b (second conductive connection) separately from each other. The electrode 315a, 309a and the contact plug 307 are electrically connected by the wiring 320a.

As described in the above, as shown in FIG. 25, it is possible to obtain a semiconductor device having a capacitor on the lower structure. Thereafter, a passivation film is formed but explanation thereof will be omitted herein.

As described, in the manufacturing step according to this embodiment, the number of lithographic steps is four, which is the same as that of a conventional single-layer capacitor. Therefore, capacitance of the capacitor per unit area can be increased without increasing the number of lithographic steps.

As described, also in this embodiment, the same effect as in the first embodiment can be obtained. More specifically, the capacitance per unit area can be increased without increasing the number of lithographic steps. Furthermore, it is possible to prevent braking of wire or the concentration of an electric field at the edge portion of the capacitor in comparison with the conventional folded capacitor. As a result, the reliability and yield can be improved.

In this embodiment, a PZT film is used as a dielectric film, a Pt film is used as an electrode film. Other films may be used. As the dielectric film, an $SrBi_2Ta_2O_9$ film, $Bi_3Ti_4O_{12}$ film, barium titanate ($BaTiO_3$) film, $(Bi, La)_3Ti_4O_{12}$ film or the like may be used. As an electrode film, an iridium (Ir) film, iridium dioxide film, ruthenium (Ru) film, ruthenium dioxide film, $SrRuO_3$ film, or the like may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming a stacked film above a semiconductor substrate, the stacked film comprising a first conductive film, a second conductive film provided below the first conductive film, a third conductive film provided below the second conductive film, a first dielectric film provided between the first conductive film and the second conductive film, and a second dielectric film provided between the second conductive film and the third conductive film;

forming a capacitor structure comprising a first electrode formed of the first conductive film, a second electrode formed of the second conductive film, and a third electrode formed of the third conductive film by patterning the stacked film;

forming an insulating film covering the capacitor structure and having a first hole reaching the first electrode, a second hole reaching the second electrode and a third hole reaching the third electrode; and forming a first conductive connection electrically connecting the first electrode and the third electrode and having portions buried in the first and third holes, and a second conductive connection formed separately from the first conductive connection and having a portion buried in the second hole, wherein forming the capacitor structure comprises:

patterning the first conductive film to form the first electrode and a ring-shape conductive portion surrounding the first electrode;

forming a mask pattern covering the first electrode and a part of the ring-shape conductive portion;

patterning the first dielectric film with the ring-shape conductive portion and the mask pattern used as a mask;

patterning the ring-shape conductive portion with the mask pattern used as a mask to form a ring-shape electrode; and patterning the second conductive film with the patterned first dielectric film used as a mask.

2. The method according to claim 1, wherein the first, second and third electrodes are formed of the same material.

3. The method according to claim 1, wherein the first and second dielectric films are formed of the same material.

* * * * *